US009681542B2

(12) United States Patent
Ziegler et al.

(10) Patent No.: US 9,681,542 B2
(45) Date of Patent: Jun. 13, 2017

(54) FLEXIBLE CIRCUIT WITH PARTIAL GROUND PATH

(71) Applicant: Oracle International Corporation, Redwood City, CA (US)

(72) Inventors: Karl Ziegler, Denver, CO (US); Kevin D. McKinstry, Westminster, CO (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 14/541,843

(22) Filed: Nov. 14, 2014

(65) Prior Publication Data

US 2016/0140987 A1 May 19, 2016

(51) Int. Cl.

*G11B 5/48* (2006.01)
*H05K 1/09* (2006.01)
*G11B 33/14* (2006.01)
*H05K 1/02* (2006.01)
*H05K 1/11* (2006.01)
*G11B 5/60* (2006.01)
*H05F 3/00* (2006.01)
*G11B 5/40* (2006.01)
*H05K 3/12* (2006.01)
*H05K 3/32* (2006.01)

(52) U.S. Cl.

CPC ......... *H05K 1/092* (2013.01); *G11B 33/1493* (2013.01); *H05K 1/0259* (2013.01); *H05K 1/117* (2013.01); *H05K 1/118* (2013.01); *G11B 5/40* (2013.01); *G11B 5/6094* (2013.01); *H05F 3/00* (2013.01); *H05K 3/1216* (2013.01); *H05K 3/321* (2013.01)

(58) Field of Classification Search

CPC .... G11B 5/6094; G11B 23/50; G11B 33/1493
USPC ......... 360/97.21, 234.4–234.5, 244.1, 245.8, 360/245.9
See application file for complete search history.

(56) References Cited

U.S. PATENT DOCUMENTS 4,644,092 A * 2/1987 Gentry ................ H01B 7/0838 174/102 C
4,677,521 A * 6/1987 Frazier .................... A61N 1/14 361/220
6,323,445 B1 * 11/2001 Yee .............................. 200/5 A
6,815,620 B2 * 11/2004 Dodsworth et al. .......... 174/258
6,995,954 B1 * 2/2006 Coon .................. G11B 5/4833 360/244.3

(Continued)

OTHER PUBLICATIONS

Electrostatic Discharge Screen Print Ink., Nov. 1, 1991, IBM Technical Disclosure Bulletin, Nov. 1991, US, vol. 34, Iss: 6, p. 92.*

(Continued)

*Primary Examiner* — Carlos E Garcia
(74) *Attorney, Agent, or Firm* — Invoke

(57) ABSTRACT

A head assembly for a magnetic tape storage device includes a head and a flexible circuit connected to the head. The flexible circuit includes a gripping portion, an end including electrical contacts for the head, conductors extending from the electrical contacts, and ink patterned onto the electrical contacts and gripping portion to form electrical paths therebetween. The ink conducts electrostatic charge from the electrical contacts and conductors to a grounded user in response to skin of the user contacting the ink.

13 Claims, 3 Drawing Sheets

(56) References Cited

U.S. PATENT DOCUMENTS

| | | | | |
|---|---|---|---|---|
| 8,848,319 | B1 * | 9/2014 | Li et al. | 360/245.9 |
| 2002/0139569 | A1 | 10/2002 | Dodsworth | |
| 2004/0185284 | A1 | 9/2004 | Ho et al. | |
| 2004/0214461 | A1 * | 10/2004 | Kao et al. | 439/181 |
| 2006/0023382 | A1 | 2/2006 | Bandy, IV et al. | |
| 2006/0098351 | A1 * | 5/2006 | Iben | 360/323 |
| 2007/0074234 | A1 * | 3/2007 | Peng | 720/650 |
| 2008/0170326 | A1 * | 7/2008 | Feng et al. | 360/99.04 |
| 2008/0291575 | A1 * | 11/2008 | Arai et al. | 360/245.9 |
| 2009/0290260 | A1 | 11/2009 | Bandy, IV et al. | |
| 2010/0052995 | A1 | 3/2010 | Lee et al. | |
| 2010/0246065 | A1 * | 9/2010 | Feng | 360/234.5 |
| 2011/0035761 | A1 * | 2/2011 | Ueno | 720/601 |
| 2012/0033332 | A1 * | 2/2012 | Bandy, IV | G11B 5/00817 360/323 |
| 2015/0070622 | A1 * | 3/2015 | Christophy | G06F 1/182 349/58 |
| 2015/0216024 | A1 * | 7/2015 | Kwong | H05K 9/0067 361/220 |

OTHER PUBLICATIONS

International Search Report and Written Opinion dated Feb. 12, 2016 for International Application No. PCT/US2015/058930, filed Nov. 4, 2015, 11 pgs.

* cited by examiner

FLEXIBLE CIRCUIT WITH PARTIAL GROUND PATH

TECHNICAL FIELD

This application relates to flexible circuits and constructions thereof.

BACKGROUND

Flexible electronics, or flex circuits, are electronic circuits formed by mounting electronic devices on flexible substrates, such as polyimide or transparent conductive polyester film. Flex circuits can also be screen printed silver circuits on polyester. Flexible printed circuits are made with photolithographic technology. In other examples, flexible foil circuits or flexible flat cables can be manufactured by laminating thin copper strips between two layers of PET coated with a thermosetting adhesive and activated during the lamination process.

Flex circuits can conform to a desired shape and be advantageous in certain situations including (a) tightly assembled electronic packages in which electrical connections are required in 3 axes, (b) electrical connections in which the assembly is required to flex during use, (c) electrical connections between sub-assemblies to replace wire harnesses, and (d) electrical connections in which board thickness or space constraints are limiting factors.

SUMMARY

A magnetic tape storage device includes a head assembly. The head assembly includes a head and flexible circuit connected to the head. The flexible circuit includes a gripping portion, an end including electrical contacts for the head, conductors extending from the electrical contacts, and ink patterned onto the electrical contacts and gripping portion to form electrical paths therebetween to conduct electrostatic charge from the electrical contacts and conductors to a grounded user in response to skin of the user contacting the ink. The ink may be a silk screen ink. The ink may have a resistivity of at least 5 kΩ/□. The ink may have a conductivity less than a conductivity of the electrical contacts but greater than a conductivity of insulating layers of the flexible circuit. A resistance of one of the electrical paths may be at least 100 kΩ.

A head assembly for a magnetic tape storage device includes a head and a flexible circuit connected to the head. The flexible circuit includes a gripping portion and an end having electrical contacts for the head, conductors extending from the electrical contacts, and traces extending between some of the contacts and gripping portion. A material of the traces has a resistivity of at least 5 kΩ/□ such that an electrical path from one of the contacts to the gripping portion defined by at least one of the traces has a resistance of at least 100 kΩ. The material may be an ink. The ink may be a silk screen ink. The material may form part of the gripping portion. The traces may touch every other one of the contacts. The material may have a conductivity less than a conductivity of the contacts but greater than a conductivity of insulating layers of the flexible circuit. The resistance may be approximately equal to 1 M.

A flexible circuit includes a substrate defining a handling portion and having electrical pads and conductors thereon. Each of the conductors extends from one of the electrical pads. The flexible circuit also includes ink layered onto the substrate in a pattern that contacts some of the electrical pads and covers some of the handling portion such that contact between skin of a grounded user and the ink causes electrostatic charge carried by the electrical pads or conductors to pass to the user via the ink. The ink may be a silk screen ink. The ink may have a resistivity of at least 5 kΩ/□. The ink may have a conductivity less than a conductivity of the electrical pads but greater than a conductivity of insulating layers associated with the substrate. The ink may be in contact with every other one of the electrical pads. A resistance associated with the pattern may be at least 100 kΩ.

DETAILED DESCRIPTION

Figure 1:
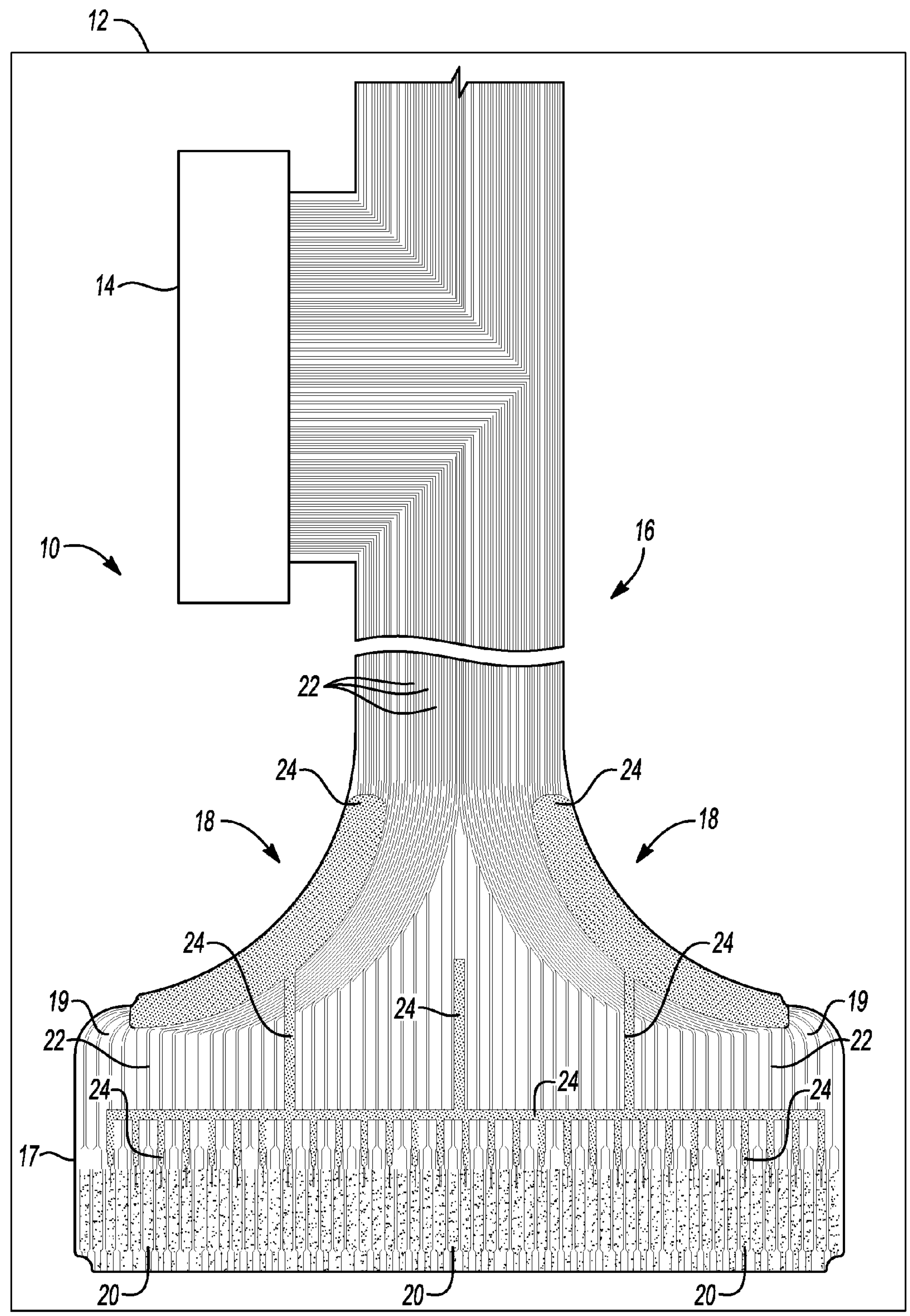
FIG. 1 is a plan view of a head assembly for a tape storage device.

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention.

As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

There are several basic constructions associated with flexible circuits including single-sided flex circuits, double access or back bared flex circuits, sculptured flex circuits, double-sided flex circuits, multilayer flex circuits, rigid-flex circuits, and polymer thick film flex circuits.

Single-sided flexible circuits have a single conductor layer made of either, for example, a metal or conductive polymer on a flexible dielectric film. Component termination features are accessible from one side. Holes may be formed in the base film to allow component leads to pass through for interconnection.

Double access or back bared flexible circuits have a single conductor layer. Selected features of the conductor pattern, however, are accessible from both sides.

Sculptured flexible circuits (a subset of flexible circuit structures) are manufactured via a multi-step etching method which yields copper conductors of differing thickness along the circuit. For example, conductors can be thin in flexible areas and thick at interconnection points.

Double-sided flexible circuits have two conductor layers, and can be fabricated with or without plated through holes. The plated through holes permit terminations for electronic components to be provided on both sides of the circuit. As such, components can be placed on either side. Protective cover layers can be placed on one, both or neither side of the completed circuit.

Multilayer flexible circuits have three or more layers of conductors. The layers are typically interconnected by means of plated through holes. The layers may or may not be continuously laminated together throughout the construction except in areas occupied by plated through holes.

Rigid-flexible circuits are a hybrid construction of rigid and flexible substrates laminated together into a single structure.

Polymer thick film (PTF) flexible circuits have conductors that are printed onto, for example, a polymer base film. They are typically single conductor layer structures. Two or more metal layers, however, can be printed sequentially with insulating layers printed between printed conductor layers.

Basic flex circuit materials often include a base, bonding adhesive, and metal foil. The base material is the flexible polymer film which provides the foundation for the laminate. Typically, the flex circuit base material defines most of the physical and electrical properties of the circuit. The base material in adhesiveless circuit constructions, however, defines all of the characteristic properties. A number of different materials can be used as a base including polyester, polyimide, polyethylene napthalate, polyetherimide, and various fluoropolymers.

While a wide range of thicknesses are possible, many flexible films are manufactured in the range of 12 μm to 125 μm. Thinner and thicker materials are also possible. Thinner materials are more flexible, and film stiffness usually increases in proportion to the cube of thickness.

Adhesives can be used as the bonding medium for creating a laminate. These adhesives, however, are typically the performance limiting element with respect to temperature, particularly when polyimide is the base material. Adhesive systems of different polymer families, however, can be used to address such issues. Similar to the base films, adhesives are manufactured in different thicknesses. And thickness selection is typically a function of the application. Different adhesive thicknesses, for example, are commonly used in the creation of cover layers to meet the fill demands of different copper foil thickness.

Metal foil is a common conductive element of a flexible laminate, and is the material from which circuit paths are normally etched. Although a variety of metal (and metal alloy) foils of varying thickness are used, copper foils are often preferred because of their cost and physical and electrical characteristics. Copper foils are typically electrodeposited or wrought (rolled)—yielding different properties. As a result, a number of different types of copper foil are available for flexible circuit applications. With most copper foil, a thin surface treatment is commonly applied to one side of the foil to improve its adhesion to the base film.

Flexible circuits, such as those described above, are used within magnetic tape storage devices. A head assembly, for example, can include a flex circuit connected to transducer elements of a head. Elements in recording heads of tape drives have become smaller over time. As a result, issues associated with flex circuit electrostatic discharge (ESD) have become more frequent. If, for example, a single track of a multi-track recording head does not work because of an ESD event, the entire head will not work. Techniques to manage ESD are therefore of interest.

The inventors have found through experimental observation that electrostatic charge may build up on the outside of flex circuits of a recording head, which may induce a charge in the conductors of the recording head. And when the recording head is grounded (e.g., plugged in), the induced charge in the conductors may result in problematic current flow through the head. Certain arrangements disclosed herein may facilitate reductions in electrostatic charge associated with, for example, recording heads.

Prior attempts at addressing electrostatic build up in flex circuits may have relied on the inclusion of static dissipative layers on the conductors or the insulating layers of the circuits. Such layers, however, can be expensive and ineffective at keeping the charge at 0 V for certain sensitive devices. Other attempts may have relied on a user wiping the flex circuit with isopropyl alcohol before activation. (The alcohol acts as a resistor—preventing rapid discharge.) Application inconsistencies, however, may reduce the effectiveness of this technique.

Here, an ink or other material having a known resistivity, in certain examples, can be layered on the flex circuit to create an electrical path between the conductors and portions of the flex circuit used for handling purposes. Thus, charge in these arrangements can travel from the conductors, through the ink, and dissipated when the flex circuit is handled during installation. That is, the conductors may be continuously grounded while the connector is being plugged in.

Figure 2:
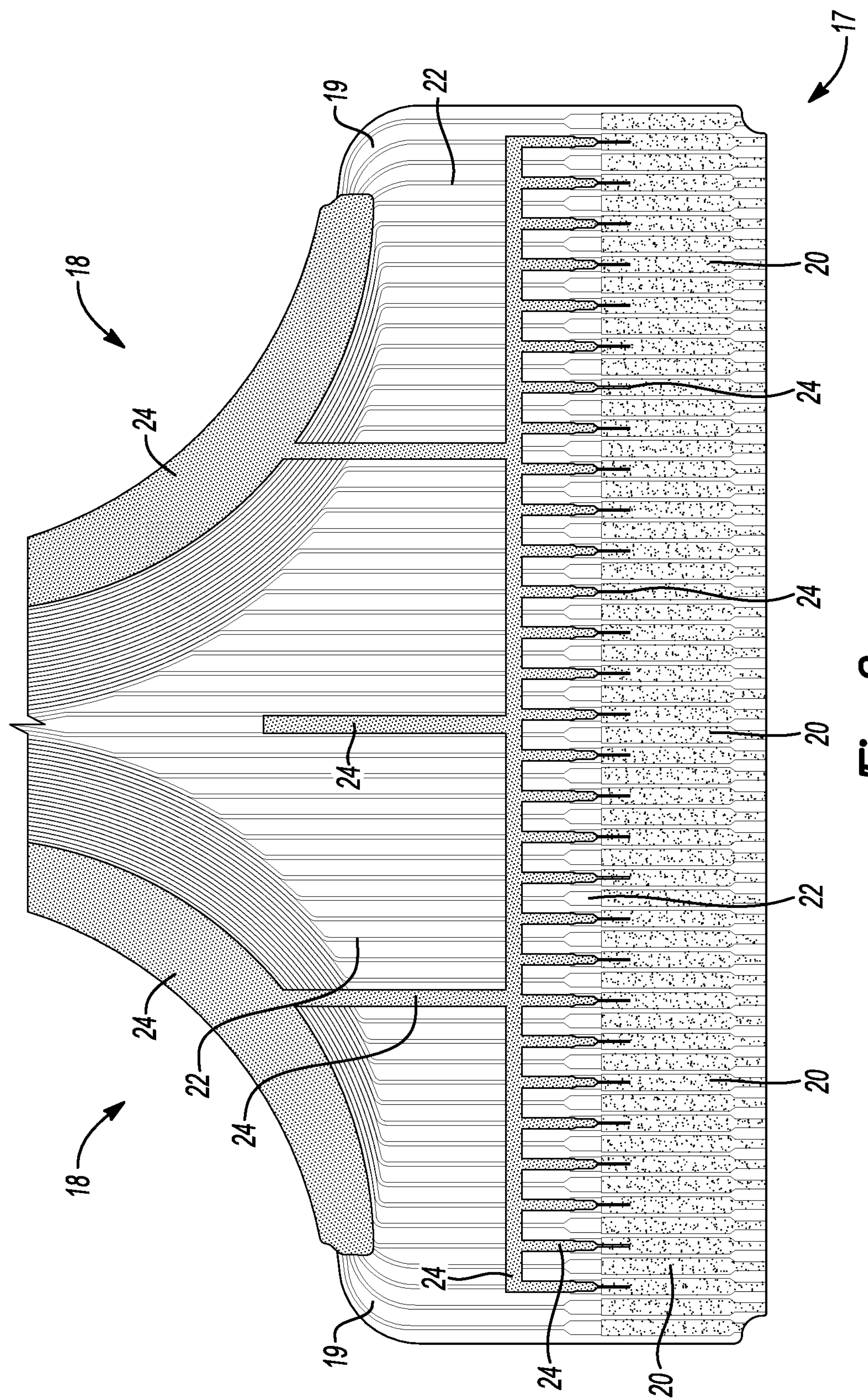
FIG. 2 is a plan view of a portion of a flexible circuit of the head assembly of FIG. 1.

Referring to FIGS. 1 and 2, a head assembly 10 for a magnetic tape storage device 12 includes a head 14 with a plurality of transducer elements and a flexible circuit 16. The flexible circuit 16 includes an end 17, a gripping portion 18, and a substrate 19 having electrical contacts or pads 20 (e.g., gold) for the head 14, conductors 22 (e.g., copper) electrically connecting the transducer elements to the electrical contacts 20, and traces 24 thereon. A zero insertion force type connector is shown. Any suitable connector, however, may be used. Moreover, the underlying basic components of the flexible circuit 16 are constructed in a manner similar to one of the examples described above. Any suitable construction, however, may be used.

The traces 24 begin at the electrical contacts 20 (every other of the electrical contacts 20 in this example), extend along the end 17 between the electrical contacts 20 and gripping portion 18, and terminate at the gripping portion 18. Space permitting, the traces 24 may begin at each of the electrical contacts 20, etc. Other configurations are also possible.

The traces 24 of FIGS. 1 and 2 are formed in a tree-like pattern. That is, thin "leaves" of the traces 24 are in contact with the electrical contacts 20, thick "trunks" of the traces 24 are formed on the perimeter of the gripping portion 18 (in areas typically used to handle the end 17, and "branches" of the traces 24 extend between the "leaves" and the "trunks." This tree-like pattern in combination with the material composition of the traces 24, as explained in more detail below, was selected to achieve a desired resistance in the static dissipative range between the electrical contacts 20 and the gripping portion 18 to facilitate electrostatic charge dissipation when handled.

If silk screening techniques are used to apply the traces 24, silk screening alignment tolerances should be considered when selecting a width for the electrical contacts 20. The width of each of the electrical contacts in the example of FIGS. 1 and 2 is 0.64 mm. Moreover if printing on edge is required, a small area, for example 1 mm, should be cut out at the perimeter so the edge is exposed.

The traces 24, in the example of FIGS. 1 and 2, are an ink (e.g., silk screen ink) that is applied (e.g., silk screened) onto the underlying gripping portion 18, electrical contacts 20, and conductors 22 of the flexible circuit 16. Other suitable materials (e.g., thin metal films, etc.), however, may be used. The ink forming the traces 24 has a resistivity of at least 500 kΩ/□. Other inks and suitable trace materials can have a resistivity in the range of, for example, 5 kΩ/□ to 1 MΩ/□ provided that such resistivity in combination with the trace pattern/dimensions yields a desirable resistance in the static dissipative range (e.g., 100 kΩ to 100 GΩ). Put a different way, certain trace materials may have conductivities less than a conductivity of the electrical contacts 20 but greater than a conductivity of insulating layers of the flexible circuit 16.

Given the electrical characteristics of the ink described above and the tree-like pattern formed by the traces 24, a resistance of an electrical trace path between one of the electrical contacts 20 and that section of the gripping portion 18 covered by the ink is approximately 1 M. Resistances in other such electrical paths in other examples may range from at least 100 kΩ to more than 1 MΩ depending on application and design requirements.

Figure 3A:
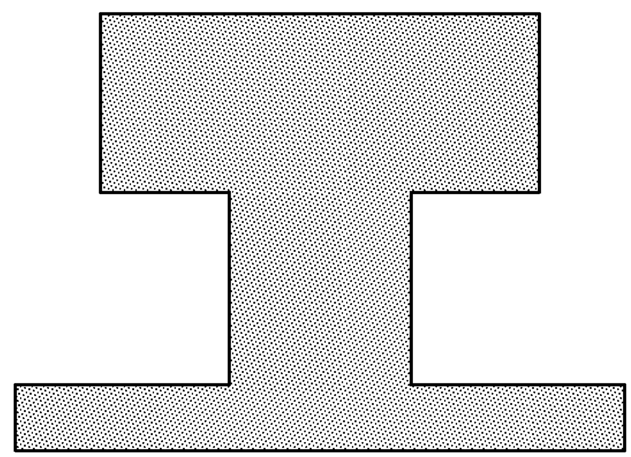
FIGS. 3A through 3C are schematic views of trace patterns for flexible circuits.
Figure 3B:
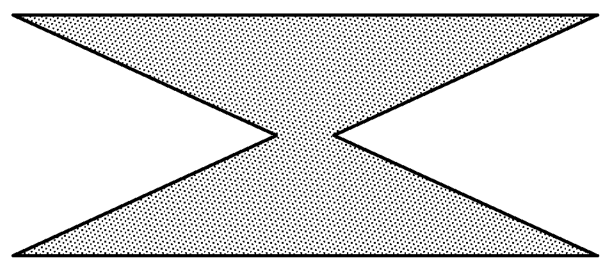
Figure 3C:
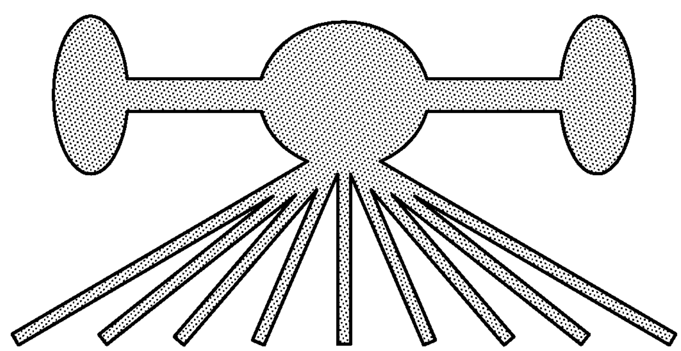

Referring to FIGS. 3A through 3C, other example trace patterns are schematically shown. If, for example, the same trace material was used to create these patterns, it is likely that the resistances associated with the electrical paths defined by these trace patterns would be different. It is possible, however, that with proper selection of trace material for each design similar path resistances could be achieved. That is, a change in trace material resistivity from pattern to pattern may offset the impact the differing patterns have on electrical path resistance defined by the traces.

Flexible circuits adopting the trace concepts discussed herein may improve yield for assemblies incorporating such flexible circuits as the number of assemblies lost due to ESD events during plug-in may be reduced. Likewise, reliability may be improved as handling of the flexible circuits may cause electrostatic charge to dissipate prior to it becoming problematic.

The words used in the specification are words of description rather than limitation, and it is understood that various changes may be made without departing from the spirit and scope of the disclosure.

As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A magnetic tape storage device comprising:

a head assembly including a head and flexible circuit connected to the head, wherein the flexible circuit includes an end including electrical contacts for the head, a gripping portion defined by flared edge portions of the flexible circuit before the end, conductors extending from the electrical contacts, and ink patterned onto the electrical contacts and gripping portion to form electrical paths of predefined shape therebetween to conduct electrostatic charge from the electrical contacts and conductors to a grounded user in response to skin of the grounded user contacting the ink, wherein the ink has a conductivity less than a conductivity of the electrical contacts but greater than a conductivity of insulating layers of the flexible circuit and wherein the electrical paths have dimensions that are based on the conductivity of the ink such that resistance between the electrical contacts and gripping portion falls within a predefined target range.

2. The magnetic tape storage device of claim 1, wherein the ink is a silk screen ink.

3. The magnetic tape storage device of claim 1, wherein the resistance is at least 100 kΩ.

4. A head assembly for a magnetic tape storage device comprising:

a head; and a flexible circuit connected to the head and including an end having electrical contacts for the head, a gripping portion defined by flared edge portions of the flexible circuit before the end, conductors extending from the electrical contacts, and traces of predefined shape extending between some of the electrical contacts and gripping portion, wherein a material of the traces has a conductivity less than a conductivity of the electrical contacts but greater than a conductivity of insulating layers of the flexible circuit and wherein the traces have dimensions that are based on the conductivity of the material such that resistance between the electrical contacts and gripping portion falls within a predefined target range.

5. The assembly of claim 4, wherein the material is an ink.

6. The assembly of claim 5, wherein the ink is a silk screen ink.

7. The assembly of claim 4, wherein the material forms part of the gripping portion.

8. The assembly of claim 4, wherein the traces touch every other one of the electrical contacts.

9. The assembly of claim 4, wherein the predefined target range includes 1 MΩ.

10. A flexible circuit comprising:

a substrate having electrical pads and conductors on an end thereof, and flared edge portions defining a handling portion before the end, wherein each of the conductors extends from one of the electrical pads; and ink layered onto the substrate in a pattern having a predefined shape that contacts some of the electrical pads and covers some of the handling portion such that contact between skin of a grounded user and the ink causes electrostatic charge carried by the electrical pads or conductors to pass to the grounded user via the ink, wherein the ink has a conductivity less than a conductivity of the electrical pads but greater than a conductivity of insulating layers associated with the substrate and wherein the shape has dimensions that are based on the conductivity of the ink such that resistance between the electrical pads and tripping portion falls within a predefined target range.

11. The circuit of claim 10, wherein the ink is a silk screen ink.

12. The circuit of claim 10, wherein the ink is in contact with every other one of the electrical pads.

13. The circuit of claim 10, wherein the resistance is at least 100 kΩ.

* * * * *